United States Patent
Ganusov et al.

(10) Patent No.: US 10,320,386 B1
(45) Date of Patent: Jun. 11, 2019

(54) PROGRAMMABLE PIPELINE INTERFACE CIRCUIT

(71) Applicant: Xilinx, Inc., San Jose, CA (US)

(72) Inventors: Ilya K. Ganusov, San Jose, CA (US); Brian C. Gaide, Erie, CO (US); Henri Fraisse, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 1 day.

(21) Appl. No.: 15/836,571

(22) Filed: Dec. 8, 2017

(51) Int. Cl.
| | |
|---|---|
| *H03K 19/00* | (2006.01) |
| *H03K 19/003* | (2006.01) |
| *H03K 19/20* | (2006.01) |
| *H03K 19/0175* | (2006.01) |
| *H03K 19/173* | (2006.01) |
| *H03K 3/037* | (2006.01) |
| *H03K 19/177* | (2006.01) |

(52) U.S. Cl.
CPC ....... *H03K 19/00323* (2013.01); *H03K 3/037* (2013.01); *H03K 19/017581* (2013.01); *H03K 19/1737* (2013.01); *H03K 19/1774* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 5,315,181 A | * | 5/1994 | Schowe | G06F 1/08 326/93 |
| 5,598,113 A | * | 1/1997 | Jex | G06F 5/06 326/94 |
| 5,751,161 A | * | 5/1998 | Wei | H03K 19/0005 326/30 |
| 7,557,560 B2 | * | 7/2009 | Negishi | G01R 31/31922 324/76.54 |
| 9,007,110 B1 | * | 4/2015 | Gaide | H03K 3/02335 327/173 |
| 9,222,971 B2 | * | 12/2015 | Wang | G01R 31/31703 |
| 9,411,554 B1 | * | 8/2016 | Young | G06F 7/5324 |
| 9,705,505 B2 | * | 7/2017 | Satou | H03K 19/1774 |
| 9,843,316 B2 | * | 12/2017 | Choi | H03K 5/15013 |
| 2005/0127944 A1 | * | 6/2005 | Lewis | H03K 19/1737 326/41 |

(Continued)

OTHER PUBLICATIONS

Schuriw, "Time Borrowing in Latches", Vivado Expert Series Blog, https://forums.xilinx.com/t5/Vivado-Expert-Series-Blog/Time-Borrowing-in-Latches/ba-p/651529, Aug. 28, 2015, pp. 1-4, Xilinx, Inc., San Jose, CA, USA.

(Continued)

*Primary Examiner* — Crystal L Hammond
(74) *Attorney, Agent, or Firm* — LeRoy D. Maunu (57) ABSTRACT

The disclosed circuit arrangements include a logic circuit, multiple bi-stable circuits, and control circuitry coupled to the bi-stable circuits. Each bi-stable circuit has a data input, a clock input, and an output coupled to the logic circuit. The control circuitry is programmable to selectively connect outputs of the bi-stable circuits or signals at the data inputs of the plurality of bi-stable circuits to inputs of the logic circuit. The control circuitry generates one or more delayed clock signals from the clock signal, and selectively provides one of the one or more delayed clock signals or the clock signal without delay to the clock input of each of the first plurality of bi-stable circuits.

20 Claims, 8 Drawing Sheets

(56) References Cited

U.S. PATENT DOCUMENTS

2009/0289660 A1* 11/2009 Ngai ................... G06F 7/506
 326/41
2016/0315618 A1* 10/2016 Takahashi ........ H03K 19/17716
2017/0117886 A1*  4/2017 Song ................... H03K 5/135
2017/0353186 A1* 12/2017 Ye ......................... H03K 3/037

OTHER PUBLICATIONS

"Time Borrowing and Time stealing", http://ohotspot.blogspot.com/2012/09/time-borrowing-and-time-stealing.html Sep. 3, 2012, pp. 1-10.

* cited by examiner

PROGRAMMABLE PIPELINE INTERFACE CIRCUIT

TECHNICAL FIELD

The disclosure generally relates to fixing hold time violations and improving performance of synchronous circuits.

BACKGROUND

"Setup time" and "hold time" describe the timing requirements on the data input of a sequential logic element, such as a flip-flop or register, with respect to a clock input. The set-up and hold times define a window of time during which data must be stable to guarantee predictable performance over a full range of operating conditions and manufacturing tolerances. The setup time is the minimum amount of time that an input data signal must be held steady before a clock event, such as a rising or falling edge of a clock signal, in order for the state of the data signal to be reliably captured. Hold time is the minimum amount of time the input data signal should be held steady after the clock event in order for the state of the data signal to be reliably captured. A setup time violation, which is sometimes referred to as a long path problem, can be remedied by reducing the path length or reducing the clock speed. A hold time violation, which is sometimes referred to as a short path problem, can be remedied by increasing the path length or adding delay circuitry to the signal path.

Some circuit timing problems may not be discovered until late in a design flow. That is, after a circuit design has been implemented as a circuit, errors may be discovered during testing. Fixing the circuit design at this late stage may be prohibitively expensive. In an effort to address late-discovered timing problems, some designs include pipeline registers nearly "everywhere" in the circuit design, for example, at the input and output of each flip-flop. Circuits having pipeline registers at every location may be advantageous for optimizing timing but can be very costly.

SUMMARY

The disclosed circuit arrangements include a logic circuit, multiple bi-stable circuits, and control circuitry coupled to the bi-stable circuits. Each bi-stable circuit has a data input, a clock input, and an output coupled to the logic circuit. The control circuitry is programmable to selectively connect outputs of the bi-stable circuits or signals at the data inputs of the plurality of bi-stable circuits to inputs of the logic circuit. The control circuitry generates one or more delayed clock signals from the clock signal, and selectively provides one of the one or more delayed clock signals or the clock signal without delay to the clock input of each of the first plurality of bi-stable circuits.

Another disclosed circuit arrangement includes a plurality of blocks of programmable logic circuitry. Each block of programmable logic circuitry is configurable to implement a logic function. The programmable interconnect circuitry is configurable to selectively route signals between the plurality of blocks of programmable logic. Interface circuits are coupled to the blocks of programmable logic circuitry, respectively. Each interface circuit includes multiple bi-stable circuits, and control circuitry coupled to the bi-stable circuits. Each bi-stable circuit has a data input, a clock input, and an output coupled to the logic circuit. The control circuitry is programmable to selectively connect outputs of the bi-stable circuits or signals at the data inputs of the plurality of bi-stable circuits to inputs of the logic circuit. The control circuitry generates one or more delayed clock signals from the clock signal, and selectively provides one of the one or more delayed clock signals or the clock signal without delay to the clock input of each of the first plurality of bi-stable circuits.

Other features will be recognized from consideration of the Detailed Description and Claims, which follow.

BRIEF DESCRIPTION OF THE DRAWINGS

Various aspects and features of the circuitry will become apparent upon review of the following detailed description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed circuits and methods involve interface circuits at the inputs of blocks of logic circuitry. Each interface circuit selectively enables pipelining, selectively time borrows, and/or selectively increases delays on minimum delay paths for the inputs to a block of logic circuitry. Each block of logic circuitry can have an associated interface circuit that individually controls each bit input to the block. The interface circuit can selectively allow input data signals to bypass the interface for input to the block, selectively pipeline the input data signals before input to the block, selectively pipeline the input data signals with a delayed clock signal for time borrowing, and selectively stall fast paths to enable time borrowing on other paths.

By concentrating registers in an interface circuit near the inputs to blocks of logic circuitry and coupling the registers to clock delay elements to borrow time, much of the advantage of having pipeline registers nearly everywhere can be achieved without the high cost by forcing registers near the inputs to behave as if the registers were placed nearer the source flip-flop on a given path. The interface circuit can also be used to facilitate globally aggressive time borrowing by stalling faster data paths and to more generally fix hold violations. Because placement of the interface registers is concentrated near the inputs of the block of logic circuitry, the interface registers are more likely to share the same control set (clock, clock-enable, and reset) as the block of logic circuitry, thereby reducing the cost of enabling registers as no multiplexers are needed for selection of signals from the control set.

In an effort to improve performance of integrated circuitry, the interface circuits are provided proximate blocks of logic circuitry. Each interface circuit is programmable to provide selective pipelining of input signals to a block of logic circuitry. Each interface circuit includes multiple bi-stable circuits and control circuitry. Each of the bi-stable circuits is coupled to receive an input data signal and coupled to output a data signal to an input of the block of logic circuitry. The control circuitry controls the clock signal to the bi-stable circuits. The control circuitry is programmable to selectively provide a delayed clock signal or the clock signal without delay to the clock input of each of the bi-stable circuits. The control circuitry is also programmable to selectively connect outputs of the bi-stable circuits or signals at the data inputs of the bi-stable circuits to inputs of the block of logic circuitry.

Figure 1:
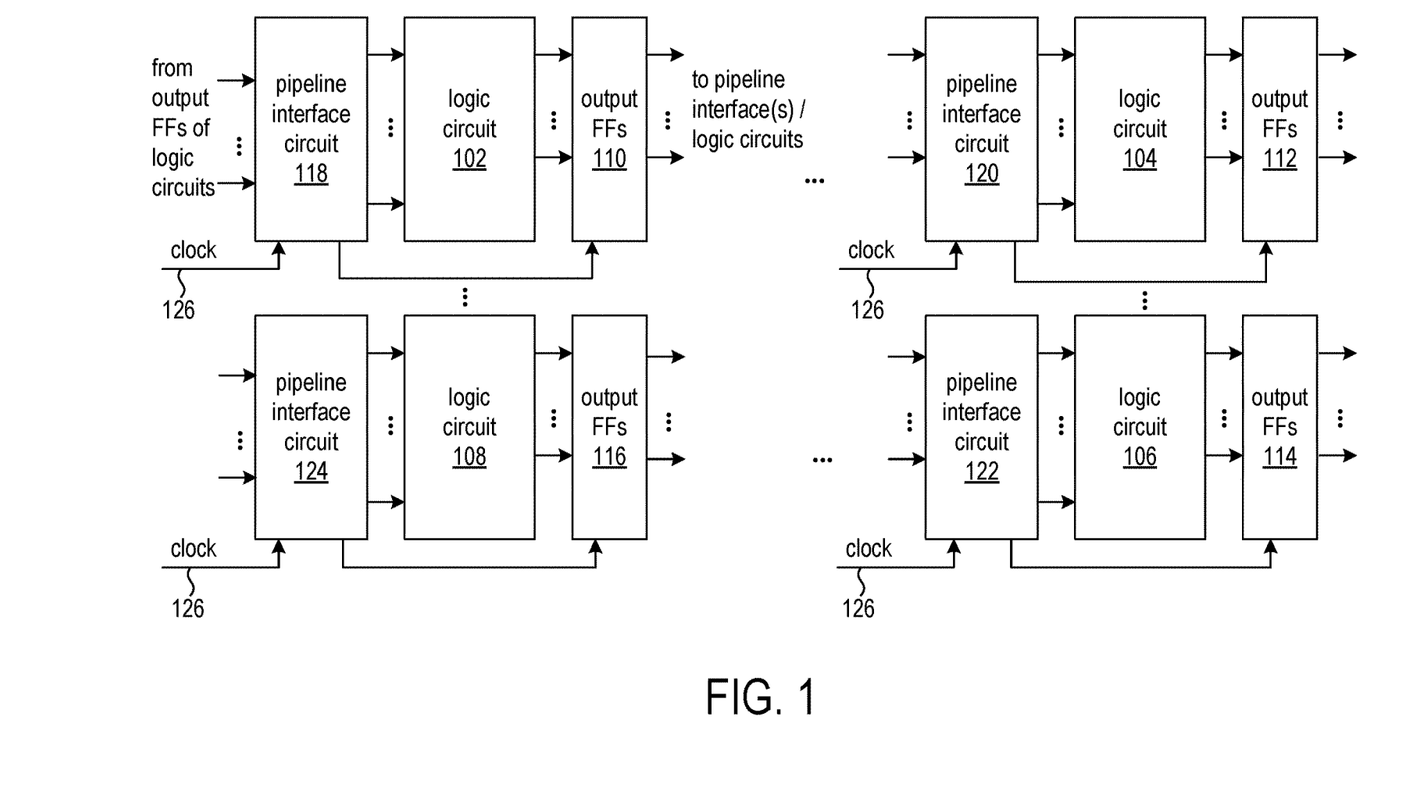
FIG. 1 shows a system having multiple blocks of logic circuitry, each of which has a respective pipeline interface circuit that can be used to enhance performance of the system.

FIG. 1 shows a system having multiple blocks of logic circuitry, each of which has a respective pipeline interface circuit that can be used to enhance performance of the system. The system includes multiple blocks of logic circuitry, which are shown as blocks 102, 104, 106, 108, and which may be referred to as "logic circuits" or "logic blocks." Each block of logic circuitry includes combinational logic, which can be either hardwired logic or programmable logic circuitry. Hardwired logic is a circuit having a fixed logic function. Programmable logic can be configured to implement different combinational logic functions by storing configuration data in a configuration memory, which configures the states of look-up tables and routing circuitry, for example. A block of logic circuitry may be alternatively referred to as a "logic circuit" or a "logic block" herein.

Each of the logic blocks has an associated set of one or more output flip-flops ("FFs") for registering the state of output signals. The sets of output flip-flops are shows as blocks 110, 112, 114, and 118. The output signals from each set of FFs 110, 112, 114, and 116 may be connected to the inputs of one or more of the logic blocks or to output pins of an IC die, depending on the implemented circuit. For example, a particular implemented circuit might have the output signals from output FFs 110 connected to the inputs of logic circuit 106 through the pipeline interface circuit 122. The connections may be hardwired, such as in an application specific integrated circuit (ASIC) implementation, or programmable such as in a field programmable gate array (FPGA) implementation.

Each of the logic blocks has an associated pipeline interface circuit that can be used to selectively pipeline and control the timing of input signals to the logic block. Pipeline interface circuit 118 is coupled to the inputs of logic block 102, pipeline interface circuit 120 is coupled to the inputs of logic block 104, pipeline interface circuit 122 is coupled to the inputs of logic block 106, and pipeline interface circuit 124 is coupled to the inputs of logic block 108. Each input signal to the logic block can be controlled individually by the associated pipeline interface circuit. For example, the pipeline interface circuit can pipeline one input signal and bypass pipelining of another input signal. Similarly, the pipeline interface circuit can individually control the timing of the input signals.

Each pipeline interface circuit includes a set of bi-stable circuits, which can be either level-sensitive latches or edge-triggered flip-flops. The pipeline interface circuit uses the bi-stable circuits in selectively pipelining signals to the associated logic block.

Each of the pipeline interface circuits generates different clock signals from an input clock signal 126. For example, each pipeline interface circuit can generate a pulsed clock signal, a delayed pulse clock signal, and a wide pulse clock signal and selectively provide the clock signals to the set of bi-stable circuits in the pipeline interface circuit.

In another aspect, each pipeline interface circuit can provide a selected clock signal to the output FFs associated with the logic block to which the pipeline interface circuit controls input signals. For example, each pipeline interface circuit can selectively provide a delayed version of clock signal 126 or a non-delayed version of clock signal 126 to the clock inputs of the output FFs.

Along with the operational characteristics, FIG. 1 generally illustrates a physical layout of logic blocks and the associated sets of output FFs and associated pipeline interface circuits. Each pipeline interface circuit is disposed proximate the inputs of the associated logic block. That is, the pipeline interface circuit associated with a logic block is placed adjacent to the logic block on an IC die. No other logic blocks, FFs, memories, etc., are disposed between the pipeline interface circuit and the associated logic block. Because the pipeline interface circuit is disposed proximate the inputs of the associated logic block, the bank of bi-stable circuits in the pipeline interface circuit are more likely to share the same control set (clock, clock-enable, and reset) as the associated logic block, thereby eliminating the resources needed to route the control set from a distant register to the logic block.

Figure 2:
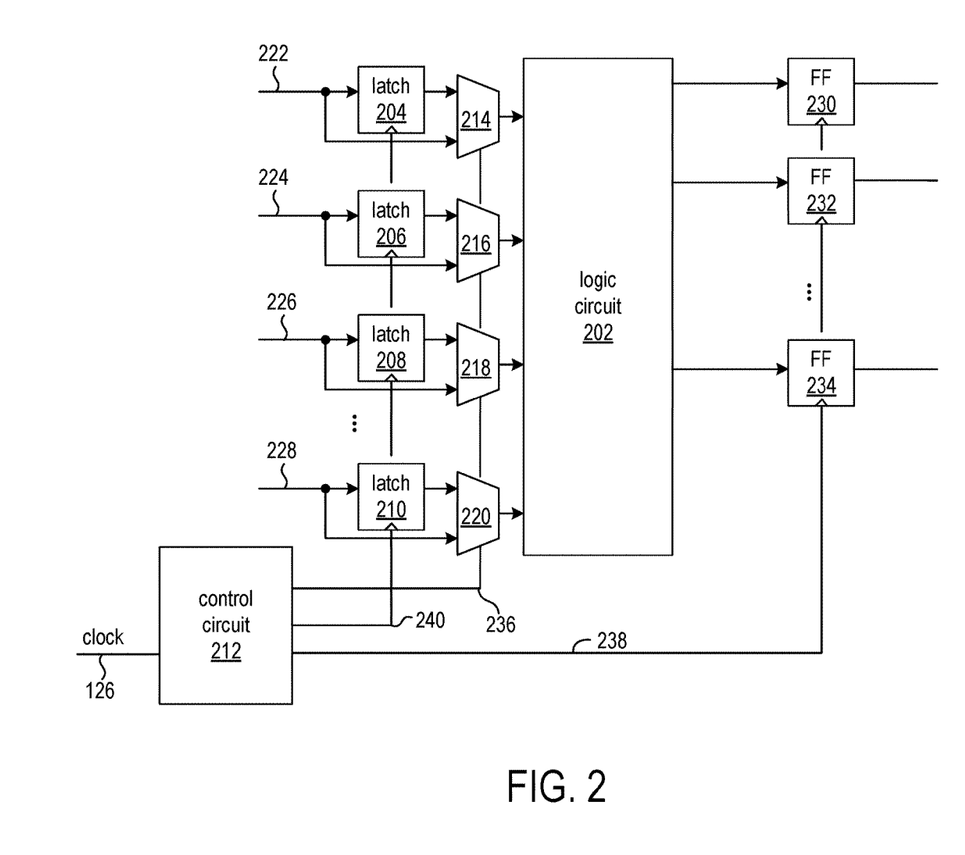
FIG. 2 shows a pipeline interface circuit connected to a logic circuit.

FIG. 2 shows a pipeline interface circuit connected to a logic circuit 202. The pipeline interface circuit includes a set of bi-stable circuits, such as latches 204, 206, 208, . . . , 210 and control circuitry. The control circuitry of the pipeline interface circuit includes control circuit 212 and multiplexers 214, 216, 218, . . . 220, along with signal line connections from the control circuit 212 to the latches and multiplexers. The pipeline interface circuit is configurable to selectively bypass a latch for asynchronous feedthrough of an input signal, pipeline non-timing-critical signals to the logic circuit, pipeline timing-critical signals to the logic circuit, pipeline and time shift signals to the logic circuit, and stall data signals to fix hold violations and enable more aggressive time borrowing. In an alternative implementation, edge-triggered flip-flops can be substituted for the latches 204, 206, 208, . . . , 210, with the control circuit 212 no longer utilizing a pulse generator.

The control circuit 212 provides respective control signals to the multiplexers 214, 216, 218, . . . 220 for selectively pipelining the input signals to the logic circuit. The single control line 236 represents the multiple control signals to the multiplexers. To pipeline an input signal to the logic circuit 202, the control circuit controls the associated multiplexer to select the output signal from the latch. To bypass pipelining, the control circuit controls the associated multiplexer to select the signal that bypasses the latch. For example, to pipeline the signal 222 for input to the logic circuit, the control circuit signals multiplexer 214 to select the output signal from latch 204. The control circuit can control selection of input signals 222, 224, 226, . . . 228 or the pipelined versions individually and separate from one another. In an exemplary implementation, the control circuit can include respective configuration memory cells that are programmable to control the selection of pipelined or non-pipelined signals.

The control circuit 212 is further configured to generate multiple different clock signals based on the input clock signal 126. The control circuit 212 generates a pulsed clock signal, a delayed pulsed clock signal, and a wide pulse clock signal. For each of the latches 204, 206, 208, . . . , 210, the control circuit selects one of the clock signals to connect to the clock input of the latch. The selections of the clock signals for connecting to the latches are independent of one another. That is, different latches can be provided with different ones of the generated clock signals. The selected clock signals are shown by line 240 that connects to the clock input of latch 210 and the lines to the clock inputs of the other latches 204, 206, and 208.

In another implementation, the pipeline interface circuit can be configured to provide a selected clock signal, which is shown as signal line 238, to the clock inputs of the output flip-flops 230, 232, . . . , 234. The control circuit is configurable to borrow time for the logic circuit 202 as well as the downstream logic circuit (not shown) driven by the output signals from the logic circuit 202 and captured in the flip-flops 230, 232, . . . , 234. The control circuit is programmable to selectively provide either the clock signal or a delayed version of the clock signal to the clock input of each of the output flip-flops 230, 232, . . . , 234.

Figure 3:
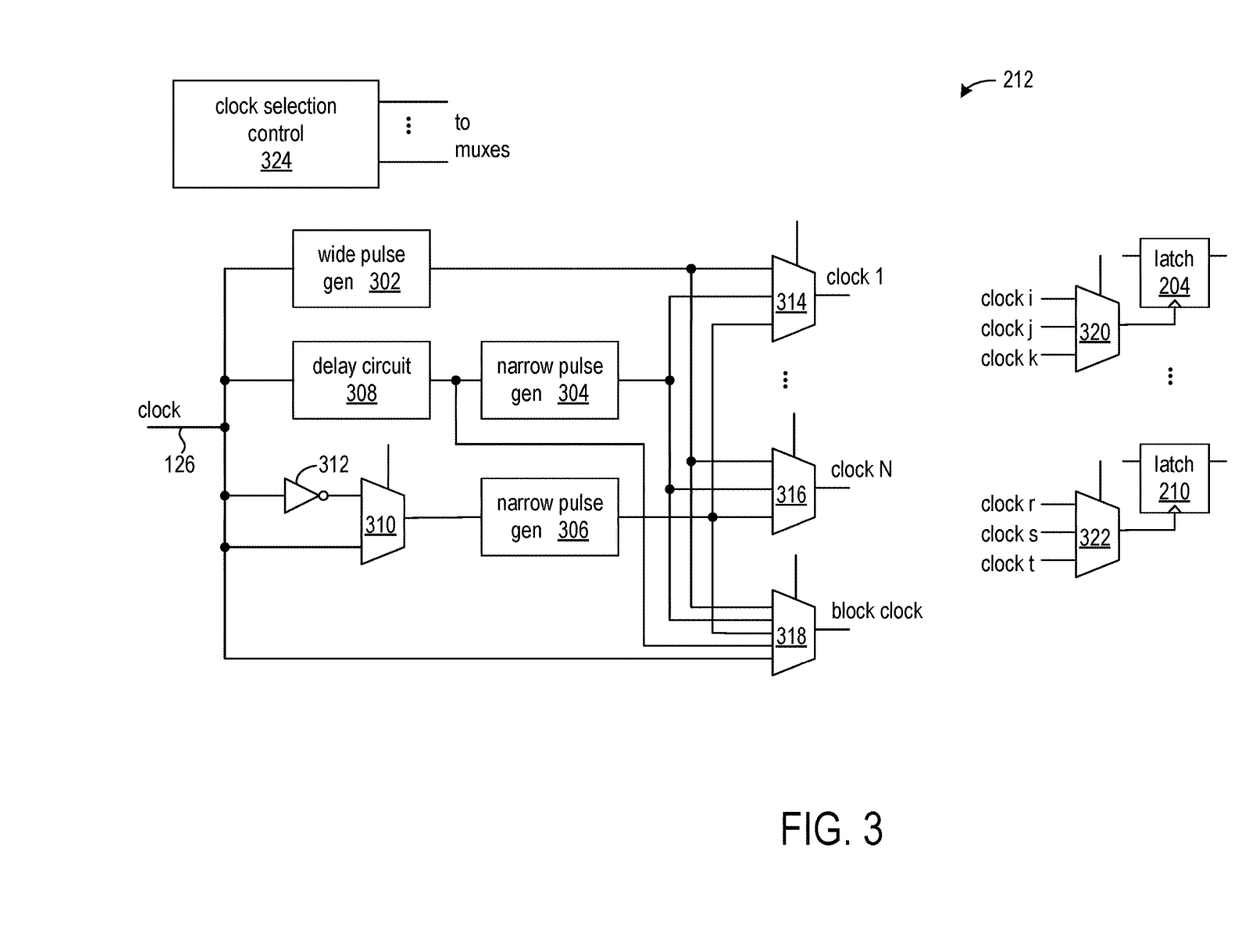
FIG. 3 shows an exemplary implementation of the control circuit of a pipeline interface circuit.

FIG. 3 shows an exemplary implementation of the control circuit 212 of a pipeline interface circuit. The control circuit generally generates multiple alternative clock signals from an input clock signal 126 and selects one of the clock signals for input to the clock input of each of the latches 204, . . . , 210.

The clock signal 126 is routed on one clock path to wide pulse generator 302. The wide pulse generator is a circuit that generates a clock pulse having a pulse width that is greater than the pulse width of the clock signals generated by narrow pulse generators 304 and 306. The wide pulse clock signal can be selected in order to time borrow on a desired path the amount of time of the width of the pulse.

The clock signal 126 is also routed on another clock path to delay circuit 308, which phase shifts the clock signal 126 to produce a delayed version of the clock signal 126. The delay circuit is programmable to introduce a desired amount of delay to the clock signal. The delayed version of the clock signal is routed to the narrow pulse generator 304, which produces a narrow pulse from the delayed clock signal. The pulse width of the clock signal produced by the narrow pulse generator 304 is narrower than the pulse width of the clock signal 126.

The clock signal 126 is routed on yet another clock path to narrow pulse generator 306. The narrow pulse generator receives one of two clock signals as selected by multiplexer 310, and generates a narrow pulse clock signal from the selected clock signal. The pulse width of the clock signal produced by the narrow pulse generator 306 is narrower than the pulse width of the clock signal 126. The multiplexer 310 selects between the output inverted clock signal from inverter 312 and the input clock signal 126. Thus, depending on the control signal applied to multiplexer 310, the narrow pulse generator produces a narrow pulse of the input clock signal or a narrow pulse during the negative phase of the input clock signal 126.

The control circuit 212 includes multiplexers 314, 316, 318, 320, . . . , 322 and clock selection control circuit 324 for selecting clocks signals for the latches 204, . . . , 210. The multiple levels of multiplexers can be used to reduce routing requirements for delivering the different clock signals to the latches. In an exemplary implementation, the each of the multiplexers 314, 316, and 318 selects from a subset of the generated clock signals, and collectively, the multiplexers 314, 316, and 318 provide a subset of the clock signal from which clock signals can be selected for the latches. For example, multiplexer 314 selects from the wide pulse clock signal from wide pulse generator 302, the delayed narrow pulse clock signal from narrow pulse generator 304, and the narrow pulse clock signal from narrow pulse generator 306. Each of multiplexers 320, 322 selects a clock signal from a subset of clock signals provided by multiplexers 314, . . . , 316, 318. For example, multiplexer 320 can select from clock signals i, j, and k, where clock i, clock j, and clock k include three of the clock signals from clock 1, . . . , clock N, and block clock. "Block clock" is the clock signal selected to drive the logic block associated with the pipeline interface circuit.

The clock selection control circuit 324 controls selection of the clock signals by the multiplexers 314, . . . , 316, 318, 320, . . . , 322. In an exemplary implementation, the clock selection control can include configuration memory cells that are programmable with values that control the selections.

Figure 4:
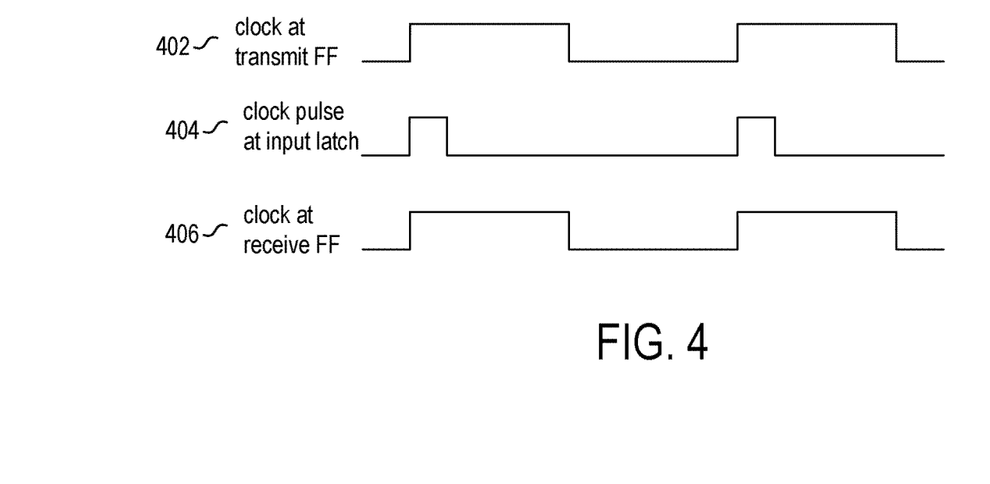
FIG. 4 shows a pulsed clock signal provided to a latch of a pipeline interface circuit.

FIGS. 4-9 show the different clock signals that can be generated and selected for the bi-stable circuits of the pipeline interface circuits and the output flip-flops of the associated logic block. FIG. 4 shows a pulsed clock signal provided to a latch of a pipeline interface circuit. The narrow pulse clock signal applied to the clock input of a latch between the transmit flip-flop and the receive flip-flop can be used to provide pipelining of a non-critical path and thereby potentially improve performance. Waveform 402 shows the clock signal at the transmit flip-flop, waveform 404 shows the narrow pulse clock signal provided to a latch in the pipeline interface circuit, and waveform 406 shows the clock at the receiving flip-flop.

Figure 5:
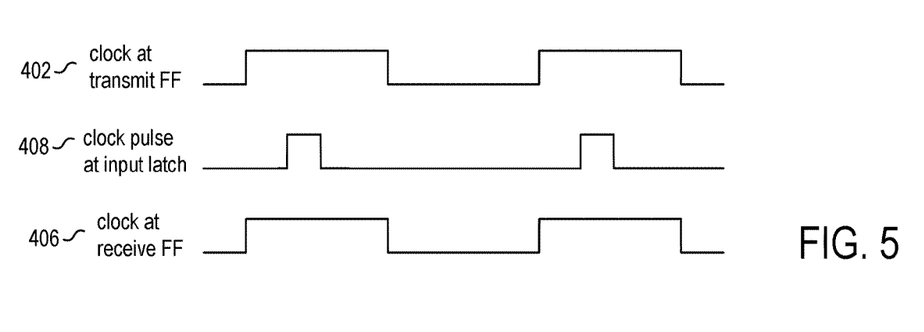
FIG. 5 shows waveforms of clock signals selected for pipelining a critical path according to one approach.
Figure 6:
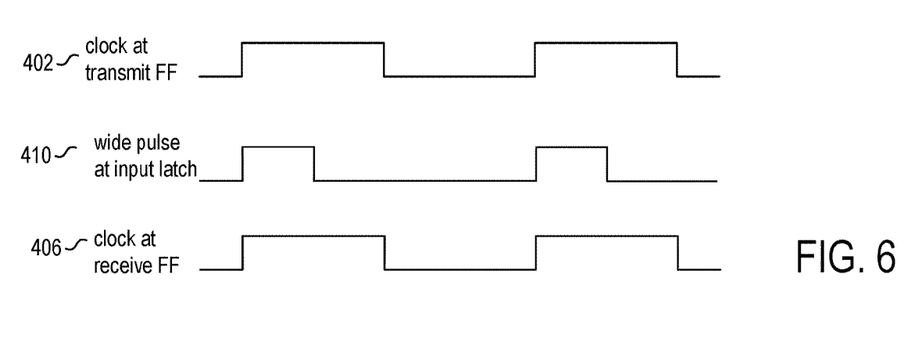
FIG. 6 shows waveforms of clock signals selected for pipelining a critical path according to another approach.

FIG. 5 shows waveforms of clock signals selected for pipelining a critical path according to one approach, and FIG. 6 shows waveforms of clock signals selected for pipelining a critical path according to another approach. Two differences between pipelining critical versus non-critical paths are that 1) critical paths can often benefit from borrowing time from the subsequent pipeline stage; and 2) non-critical paths may have shorter paths which can cause hold time violations with time borrowing. Thus, it is desirable to delay the clock pulse to critical paths but not to non-critical paths. FIGS. 5 and 6 illustrate two approaches for time borrowing. In FIG. 5, waveform 408 shows a delayed pulsed clock signal provided to a latch of a pipeline interface circuit. In FIG. 6, waveform 410 shows a wide pulse clock signal provided to the latch of a pipeline interface circuit. Note that the pulse width of the clock signal 408 (FIG. 5) is narrower than the pulse width of clock signal 410 (FIG. 6).

Each disclosed pipeline interface circuit can also be used to borrow time for the associated logic block as well as the pipeline interface. Time borrowing for both the interface circuit and the logic block can be useful if the data path delay between pipeline interface and logic block is too large and does not have timing slack for time-borrowing, but the next path originating from the same logic block to the next is short.

Figure 7:
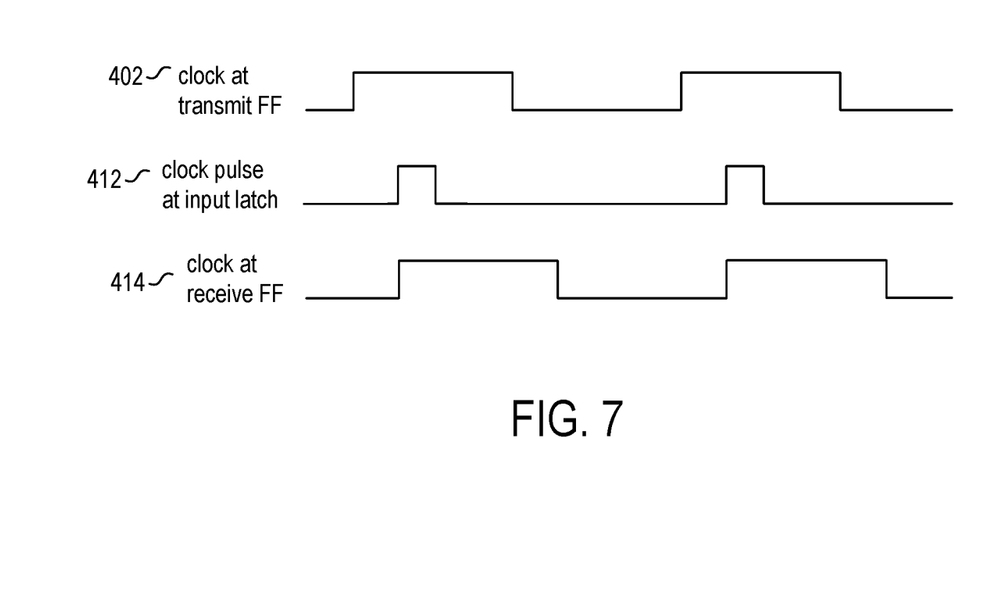
FIG. 7 shows waveforms of clock signals that provide pipelining by the pipeline interface circuit and time borrowing for the interface circuit and the logic block.

FIG. 7 shows waveforms of clock signals that provide pipelining by the pipeline interface circuit and time borrowing for the interface circuit and the logic block. Waveform 412 shows a delayed pulse clock signal at a latch in the pipeline interface circuit, and waveform 414 shows the delayed clock signal at the output flip-flop of the logic block.

Figure 8:
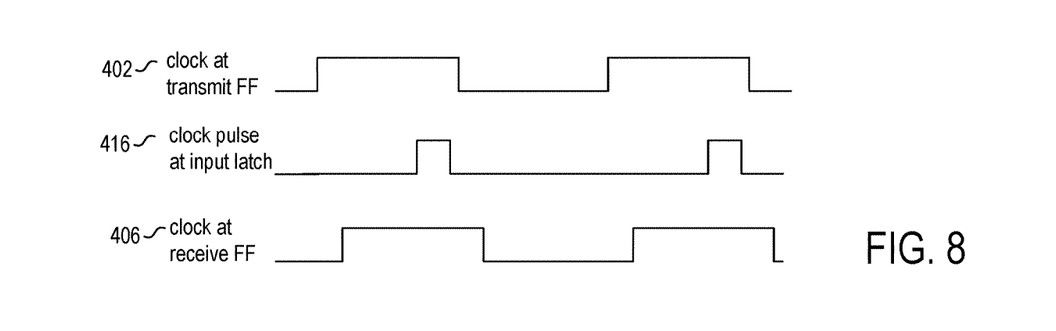
FIG. 8 shows one approach in which the pipeline interface circuit can be used to stall fast data paths and prevent hold violations.
Figure 9:
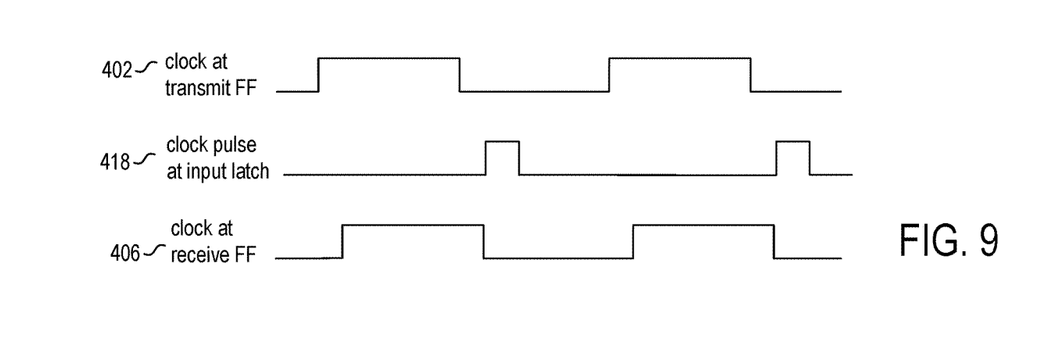
FIG. 9 shows another approach in which the pipeline interface circuit can be used to stall fast data paths and prevent hold violations.

FIGS. 8 and 9 show how the pipeline interface circuit can be used to stall fast data paths and prevent hold violations according to alternative approaches. In FIG. 8, waveform 416 shows that the delayed pulse clock signal is delayed to a latch in the pipeline interface circuit by an amount that that is beyond the metastable region of the arrival of an input data signal. In FIG. 9, waveform 418 shows that the delayed pulse clock signal is delayed to the negative edge of the clock signal at the transmit flip-flop (waveform 402), which delays the clock beyond the metastable region of the arrival of an input data signal.

Figure 10:
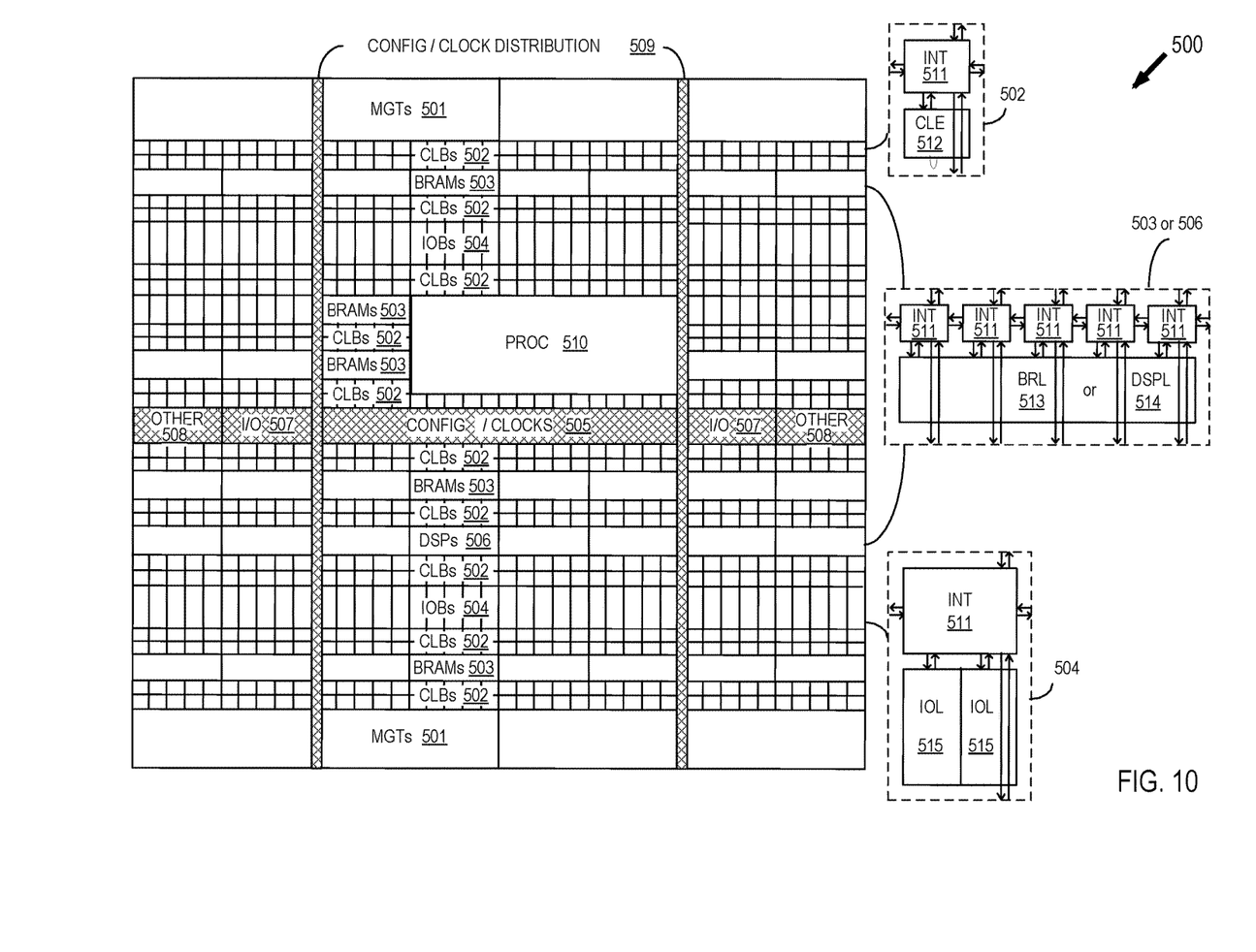
FIG. 10 shows a programmable integrated circuit (IC) on which the disclosed circuits and processes may be implemented.

FIG. 10 shows a programmable integrated circuit (IC) 500 on which the disclosed circuits and processes may be implemented. The programmable IC may also be referred to as a System On Chip (SOC) that includes field programmable gate array logic (FPGA) along with other programmable resources. FPGA logic may include several different types of programmable logic blocks in the array. For example, FIG. 10 illustrates programmable IC 500 that includes a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507, for example, clock ports, and other programmable logic 508 such as digital clock managers, analog-to-digital converters, system monitoring logic, and so forth. Some programmable IC having FPGA logic also include dedicated processor blocks (PROC) 510 and internal and external reconfiguration ports (not shown).

In some FPGA logic, each programmable tile includes a programmable interconnect element (INT) 511 having standardized connections to and from a corresponding interconnect element in each adjacent tile. Therefore, the programmable interconnect elements taken together implement the programmable interconnect structure for the illustrated FPGA logic. The programmable interconnect element INT 511 also includes the connections to and from the programmable logic element within the same tile, as shown by the examples included at the top of FIG. 10.

For example, a CLB 502 can include a configurable logic element (CLE) 512 that can be programmed to implement user logic, plus a single programmable interconnect element INT 511. A BRAM 503 can include a BRAM logic element (BRL) 513 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 506 can include a DSP logic element (DSPL) 514 in addition to an appropriate number of programmable interconnect elements. An 10B 504 can include, for example, two instances of an input/output logic element (IOL) 515 in addition to one instance of the programmable interconnect element INT 511. As will be clear to those of skill in the art, the actual I/O bond pads connected, for example, to the I/O logic element 515, are manufactured using metal layered above the various illustrated logic blocks, and typically are not confined to the area of the input/output logic element 515.

A columnar area near the center of the die (shown shaded in FIG. 10) is used for configuration, clock, and other control logic. Horizontal areas 509 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 10 include additional logic blocks that disrupt the regular columnar structure making up a large part of the programmable IC. The additional logic blocks can be programmable blocks and/or dedicated logic. For example, the processor block PROC 510 shown in FIG. 10 spans several columns of CLBs and BRAMs.

Note that FIG. 10 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 10 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The disclosed circuits and methods are thought to be applicable to a variety of systems for optimizing timing of integrated circuits. Other aspects and features will be apparent to those skilled in the art from consideration of the specification. The circuits and methods may be implemented as an application specific integrated circuit (ASIC) or as programmable logic. It is intended that the specification and drawings be considered as examples only, with a true scope of the invention being indicated by the following claims.

What is claimed is:

1. A circuit arrangement comprising:
   a logic circuit;
   a first plurality of bi-stable circuits, each bi-stable circuit of the first plurality having a data input, a clock input, and an output coupled to the logic circuit;
   control circuitry coupled to the first plurality of bi-stable circuits, wherein the control circuitry is programmable to:
      receive an input clock signal;
      selectively connect, responsive to a first plurality of control signals, outputs of the first plurality of bi-stable circuits or signals at the data inputs of the plurality of bi-stable circuits to inputs of the logic circuit,
      generate one or more delayed clock signals from the input clock signal, and
      selectively provide, responsive to a second plurality of control signals, one of the one or more delayed clock signals or the input clock signal without delay to the clock input of each of the first plurality of bi-stable circuits.

2. The circuit arrangement of claim 1, wherein the control circuitry is further configured to:

generate a plurality of alternative clock signals from the input clock signal; and select, for input to the clock input of each of the first plurality of bi-stable circuits, one clock signal of the plurality of alternative clock signals.

3. The circuit arrangement of claim 1, wherein the control circuitry includes:
a first clock path including a delay circuit coupled to receive the input clock signal and configured to generate one of the one or more delayed clock signals, and a first pulse generator coupled to receive the one of the delayed clock signals from the delay circuit, wherein the pulse generator is configured to reduce a pulse width of the one of the delayed clock signals and output a first clock signal;
a second clock path includes a second pulse generator coupled to receive the input clock signal, wherein the pulse generator is configured to reduce a pulse width of the input clock signal and output a second clock signal; and
wherein the control circuitry is further configured to select, for input to the clock input of each of the first plurality of bi-stable circuits, the first clock signal or the second clock signal.

4. The circuit arrangement of claim 1, further comprising:
a second plurality of bi-stable circuits, each bi-stable circuit of the second plurality having a clock input and a data input coupled to receive an output signal of the logic circuit; and
wherein the control circuitry is further programmable to selectively provide the one of the one or more delayed clock signals or the input clock signal without delay to the clock input of each of the second plurality of bi-stable circuits.

5. The circuit arrangement of claim 4, wherein the control circuitry is further programmable to selectively supply the input clock signal having a first pulse width to the first plurality of bi-stable circuits or supply the input clock signal having a second pulse width to the first plurality of bi-stable circuits and to the second plurality of bi-stable circuits, wherein the first pulse width is narrower than the second pulse width.

6. The circuit arrangement of claim 1, wherein the control circuitry includes:
a first clock path including a first delay circuit coupled to receive the input clock signal and configured to generate one of the one or more delayed clock signals, and a first pulse generator coupled to receive the one of the one or more delayed clock signals from the first delay circuit, wherein the first pulse generator is configured to reduce a pulse width of the delayed clock signal and output a first clock signal;
a second clock path includes a second pulse generator coupled to receive the input clock signal, wherein the second pulse generator is configured to reduce a pulse width of the input clock signal and output a second clock signal;
a third clock path including a third pulse generator coupled to receive the input clock signal, wherein the third pulse generator is configured to reduce a pulse width of the delayed clock signal and output a third clock signal having a pulse width greater than a pulse width of the first clock signal; and
wherein the control circuitry is further configured to select, for input to the clock input of each of the first plurality of bi-stable circuits, the first clock signal, the second clock signal, or the third clock signal.

7. The circuit arrangement of claim 6, wherein the second clock path includes:
an inverter coupled to receive the input clock signal and output an inverted clock signal; and
a multiplexer coupled to receive the inverted clock signal and the input clock signal, wherein the multiplexer is configured to select the inverted clock signal or the input clock signal for input to the second pulse generator.

8. The circuit arrangement of claim 1, wherein the first plurality of bi-stable circuits are level-sensitive latches.

9. The circuit arrangement of claim 1, wherein:
the control circuitry includes for each input to the logic circuit, a respective data selection circuit that is programmable independent of each other respective data selection circuit to selectively connect the output of a bi-stable circuit of the first plurality of bi-stable circuits or the signal at the data input the bi-stable circuit to an input of the logic circuit; and
the control circuitry includes for each of the first plurality of bi-stable circuits, a respective clock selection circuit that is programmable independent of each other respective clock selection circuit to selectively provide the one of the one or more delayed clock signals or the input clock signal without delay to the clock input of the bi-stable circuit.

10. The circuit arrangement of claim 1, wherein the first plurality of bi-stable circuits are edge-triggered flip-flops.

11. A circuit arrangement, comprising:
a plurality of blocks of programmable logic circuitry, wherein each block of programmable logic circuitry is configurable to implement a logic function;
programmable interconnect circuitry that is configurable to selectively route signals between the plurality of blocks of programmable logic;
a plurality of interface circuits coupled to the plurality of blocks of programmable logic circuitry, respectively, wherein each interface circuit includes:
a first plurality of bi-stable circuits, each bi-stable circuit of the first plurality having a data input, a clock input, and an output coupled to the respective block of programmable logic circuitry;
control circuitry coupled to the first plurality of bi-stable circuits, wherein the control circuitry is programmable to:
receive an input clock signal;
selectively connect, responsive to a first plurality of control signals, outputs of the first plurality of bi-stable circuits or signals at the data inputs of the plurality of bi-stable circuits to inputs of the respective block of programmable logic circuitry;
generate one or more delayed clock signals from the input clock signal, and
selectively provide, responsive to a second plurality of control signals, one of the one or more delayed clock signals or the input clock signal without delay to the clock input of each of the first plurality of bi-stable circuits.

12. The circuit arrangement of claim 11, wherein the control circuitry is further configured to:
generate a plurality of alternative clock signals from the input clock signal; and
select, for input to the clock input of each of the first plurality of bi-stable circuits, one clock signal of the plurality of alternative clock signals.

13. The circuit arrangement of claim 11, wherein the control circuitry includes:

a first clock path including a delay circuit coupled to receive the input clock signal and configured to generate one of the one or more delayed clock signals, and a first pulse generator coupled to receive the one of the delayed clock signals from the delay circuit, wherein the pulse generator is configured to reduce a pulse width of the one of the delayed clock signals and output a first clock signal;

a second clock path includes a second pulse generator coupled to receive the input clock signal, wherein the pulse generator is configured to reduce a pulse width of the input clock signal and output a second clock signal; and wherein the control circuitry is further configured to select, for input to the clock input of each of the first plurality of bi-stable circuits, the first clock signal or the second clock signal.

14. The circuit arrangement of claim 11, further comprising:

a second plurality of bi-stable circuits, each bi-stable circuit of the second plurality having a clock input and a data input coupled to receive an output signal of the logic circuit; and wherein the control circuitry is further programmable to selectively provide the one of the one or more delayed clock signals or the input clock signal without delay to the clock input of each of the second plurality of bi-stable circuits.

15. The circuit arrangement of claim 14, wherein the control circuitry is further programmable to selectively supply the input clock signal having a first pulse width to the first plurality of bi-stable circuits or supply the input clock signal having a second pulse width to the first plurality of bi-stable circuits and to the second plurality of bi-stable circuits, wherein the first pulse width is narrower than the second pulse width.

16. The circuit arrangement of claim 11, wherein the control circuitry includes:

a first clock path including a first delay circuit coupled to receive the input clock signal and configured to generate one of the one or more delayed clock signals, and a first pulse generator coupled to receive the one of the one or more delayed clock signals from the first delay circuit, wherein the first pulse generator is configured to reduce a pulse width of the delayed clock signal and output a first clock signal;

a second clock path includes a second pulse generator coupled to receive the input clock signal, wherein the second pulse generator is configured to reduce a pulse width of the input clock signal and output a second clock signal;

a third clock path including a third pulse generator coupled to receive the input clock signal, wherein the third pulse generator is configured to reduce a pulse width of the delayed clock signal and output a third clock signal having a pulse width greater than a pulse width of the first clock signal; and wherein the control circuitry is further configured to select, for input to the clock input of each of the first plurality of bi-stable circuits, the first clock signal, the second clock signal, or the third clock signal.

17. The circuit arrangement of claim 16, wherein the second clock path includes:

an inverter coupled to receive the input clock signal and output an inverted clock signal; and a multiplexer coupled to receive the inverted clock signal and the input clock signal, wherein the multiplexer is configured to select the inverted clock signal or the input clock signal for input to the second pulse generator.

18. The circuit arrangement of claim 11, wherein the first plurality of bi-stable circuits are level-sensitive latches.

19. The circuit arrangement of claim 11, wherein:

the control circuitry includes for each input to the logic circuit, a respective data selection circuit that is programmable independent of each other respective data selection circuit to selectively connect the output of a bi-stable circuit of the first plurality of bi-stable circuits or the signal at the data input the bi-stable circuit to an input of the logic circuit; and the control circuitry includes for each of the first plurality of bi-stable circuits, a respective clock selection circuit that is programmable independent of each other respective clock selection circuit to selectively provide the one of the one or more delayed clock signals or the input clock signal without delay to the clock input of the bi-stable circuit.

20. The circuit arrangement of claim 11, wherein the first plurality of bi-stable circuits are edge-triggered flip-flops.

* * * * *